(12) United States Patent
Xu et al.

(10) Patent No.: US 11,570,877 B2
(45) Date of Patent: Jan. 31, 2023

(54) DISPLAY PANEL AND DISPLAY APPARATUS

(71) Applicant: BOE Technology Group Co., Ltd., Beijing (CN)

(72) Inventors: Pan Xu, Beijing (CN); Yongqian Li, Beijing (CN); Guoying Wang, Beijing (CN); Dacheng Zhang, Beijing (CN); Lang Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 43 days.

(21) Appl. No.: 17/132,510

(22) Filed: Dec. 23, 2020

(65) Prior Publication Data
US 2021/0259086 A1   Aug. 19, 2021

(30) Foreign Application Priority Data

Feb. 13, 2020   (CN) .......................... 202010090479.8

(51) Int. Cl.
*H05F 3/00*   (2006.01)
*G06F 1/26*   (2006.01)
(Continued)

(52) U.S. Cl.
CPC ................. *H05F 3/00* (2013.01); *G06F 1/26* (2013.01); *G09F 9/30* (2013.01); *G09G 3/3648* (2013.01); *H01L 27/0248* (2013.01); *H02H 9/046* (2013.01)

(58) Field of Classification Search
CPC ................. G02F 1/1333; G02F 1/1362; G02F 1/136204; G02F 1/13; G02F 1/133;
(Continued)

(56) References Cited

U.S. PATENT DOCUMENTS 6,839,097 B2 * 1/2005 Park .................. G02F 1/136204
349/40
9,069,924 B2   6/2015 Chen
(Continued)

FOREIGN PATENT DOCUMENTS

CN      1610480 A     4/2005
CN    101064984 A    10/2007
(Continued)

OTHER PUBLICATIONS

Office Action dated May 31, 2021, issued in counterpart CN Application No. 202010090479.8, with English Translation. (16 pages).

*Primary Examiner* — Danny Nguyen
(74) *Attorney, Agent, or Firm* — WHDA, LLP

(57) ABSTRACT

A display panel and a display apparatus are disclosed. The display panel comprises: a plurality of signal lines extending in a first direction; at least one first reference voltage bus which extends in a second direction intersecting the first direction; and a plurality of electrostatic discharge units divided into a plurality of electrostatic discharge unit groups, wherein the plurality of electrostatic discharge unit groups are arranged in the second direction and each of the plurality of electrostatic discharge unit groups comprises at least two electrostatic discharge units arranged in the first direction, wherein at least one of the plurality of signal lines is electrically connected to the first reference voltage bus through at least one of the plurality of electrostatic discharge units.

14 Claims, 7 Drawing Sheets

(51) Int. Cl.
    *G09F 9/30* (2006.01)
    *H01L 27/02* (2006.01)
    *H02H 9/04* (2006.01)
    *G09G 3/36* (2006.01)

(58) Field of Classification Search
    CPC ..... H01L 27/02; H01L 27/10; H01L 27/0288; H01L 27/101; H01L 27/0266; H01L 27/0248; H01L 27/0255; H01L 27/1214; H05F 3/00; G09F 9/30; G09F 3/30; G06F 1/26; G09G 3/3648; G09G 3/3651; G05F 3/18; G05F 3/20; H02H 9/046
    USPC .......................................................... 361/56
    See application file for complete search history.

(56) References Cited

U.S. PATENT DOCUMENTS

| | | | |
|---|---|---|---|
| 9,831,277 B2 | 11/2017 | Gai et al. | |
| 9,893,054 B2 | 2/2018 | Chen | |
| 10,203,574 B2 | 2/2019 | Wang et al. | |
| 10,324,344 B2 | 6/2019 | Wang et al. | |
| 11,024,625 B2 | 6/2021 | Chen | |
| 2008/0158745 A1 | 7/2008 | Chen et al. | |
| 2013/0170080 A1 | 7/2013 | Chen | |
| 2015/0270260 A1 | 9/2015 | Chen | |
| 2017/0110478 A1 | 4/2017 | Gai et al. | |
| 2017/0192318 A1 | 7/2017 | Wang et al. | |
| 2018/0166439 A1 | 6/2018 | Chen | |
| 2019/0129261 A1 | 5/2019 | Wang et al. | |
| 2020/0159077 A1* | 5/2020 | Yoshida | H01L 29/7869 |
| 2020/0350309 A1 | 11/2020 | Long | |
| 2021/0210483 A1 | 7/2021 | Chen | |

FOREIGN PATENT DOCUMENTS

| | | |
|---|---|---|
| CN | 103187414 A | 7/2013 |
| CN | 105185332 A | 12/2015 |
| CN | 105304645 A | 2/2016 |
| CN | 106773410 A | 5/2017 |
| CN | 108269801 A | 7/2018 |
| CN | 108492761 A | 9/2018 |
| CN | 109031829 A | 12/2018 |
| CN | 109256053 A | 1/2019 |
| CN | 208904019 U | 5/2019 |
| CN | 110299070 A | 10/2019 |
| TW | 200824127 A | 6/2008 |
| TW | 200828232 A | 7/2008 |

\* cited by examiner

DISPLAY PANEL AND DISPLAY APPARATUS

CROSS-REFERENCE TO RELATED APPLICATION

This application claims priority to Chinese Patent Application No. 202010090479.8, filed with the National Intellectual Property Administration of China on Feb. 13, 2020, which is incorporated herein by reference in its entirety.

TECHNICAL FIELD

The present disclosure relates to the field of display technology, and particularly to a display panel and a display apparatus.

BACKGROUND

With the development of display technology, users have higher and higher demand for high-pixel-density (pixels per inch (PPI)) displays of display panels. In order to achieve the high-PPI display, not only a space for a pixel in a display area needs to be compressed, but also a space corresponding to a peripheral non-display area needs to be compressed. In addition, in practical use, external electrostatic charges can easily enter the display panel from a space where it is placed, thereby affecting the display effect of the display panel. In order to ensure the display effect of the display panel, how to achieve the electrostatic protection of the display panel in a limited space has become a technical problem to be solved urgently.

SUMMARY

According an aspect of the present disclosure, there is provided a display panel comprising: a plurality of signal lines extending in a first direction; at least one first reference voltage bus which extends in a second direction intersecting the first direction; and a plurality of electrostatic discharge units divided into a plurality of electrostatic discharge unit groups, wherein the plurality of electrostatic discharge unit groups are arranged in the second direction and each of the plurality of electrostatic discharge unit groups comprises at least two electrostatic discharge units arranged in the first direction, wherein at least one of the plurality of signal lines is electrically connected to the first reference voltage bus through at least one of the plurality of electrostatic discharge units.

In some embodiments, each of the plurality of electrostatic discharge unit groups comprises a first electrostatic discharge unit and a second electrostatic discharge unit substantially symmetrically arranged on two sides of the first reference voltage bus in the first direction.

In some embodiments, the plurality of signal lines are divided into a plurality of signal line groups in one-to-one correspondence with the plurality of electrostatic discharge unit groups, and each of the plurality of signal line groups comprises: a first signal line electrically connected to the first reference voltage bus through the first electrostatic discharge unit of a corresponding one of the plurality of electrostatic discharge unit groups; and a second signal line electrically connected to the first reference voltage bus through the second electrostatic discharge unit of the corresponding one of the plurality of electrostatic discharge unit groups.

In some embodiments, there is at least one of the plurality of signal lines between every two adjacent groups of the plurality of electrostatic discharge unit groups.

In some embodiments, the display panel further comprises: a second reference voltage bus, wherein each of the plurality of electrostatic discharge unit groups comprises: a first electrostatic discharge unit and a second electrostatic discharge unit substantially symmetrically arranged on two sides of the first reference voltage bus in the first direction; and a third electrostatic discharge unit, wherein the plurality of signal lines are divided into a plurality of signal line groups in one-to-one correspondence with the plurality of electrostatic discharge unit groups, and each of the plurality of signal line groups comprises: a first signal line electrically connected to the first reference voltage bus through the first electrostatic discharge unit of a corresponding one of the plurality of electrostatic discharge unit groups; a second signal line electrically connected to the first reference voltage bus through the second electrostatic discharge unit of the corresponding one of the plurality of electrostatic discharge unit groups; and a third signal line electrically connected to the second reference voltage bus through the third electrostatic discharge unit of the corresponding one of the plurality of electrostatic discharge unit groups.

In some embodiments, the second reference voltage bus extends in the second direction, and the first reference voltage bus and the second reference voltage bus are arranged side by side in the first direction, and the first electrostatic discharge units and the third electrostatic discharge units are located between the first reference voltage bus and the second reference voltage bus.

In some embodiments, the display panel comprises a display area, the second reference voltage bus is located on a side of the first reference voltage bus away from the display area, and there are at least the first signal line and the third signal line between every two adjacent groups of the plurality of electrostatic discharge unit groups.

In some embodiments, the at least one first reference voltage bus comprises two first reference voltage buses, each of the plurality of electrostatic discharge unit groups comprises: a first electrostatic discharge unit and a second electrostatic discharge unit substantially symmetrically arranged on two sides of one of the two first reference voltage buses in the first direction; and a third electrostatic discharge unit and a fourth electrostatic discharge unit substantially symmetrically arranged on two sides of the other of the two first reference voltage buses in the first direction, and the plurality of signal lines are divided into a plurality of signal line groups in one-to-one correspondence with the plurality of electrostatic discharge unit groups, and each of the plurality of signal line groups comprises: a first signal line electrically connected to the one of the two first reference voltage buses through the first electrostatic discharge unit of a corresponding one of the plurality of electrostatic discharge unit groups; a second signal line electrically connected to the one of the two first reference voltage buses through the second electrostatic discharge unit of the corresponding one of the plurality of electrostatic discharge unit groups; a third signal line electrically connected to the other of the two first reference voltage buses through the third electrostatic discharge unit of the corresponding one of the plurality of electrostatic discharge unit groups; and a fourth signal line electrically connected to the other of the two first reference voltage buses through the fourth electrostatic discharge unit of the corresponding one of the plurality of electrostatic discharge unit groups.

In some embodiments, the two first reference voltage buses are arranged side by side in the first direction, the second electrostatic discharge unit and the third electrostatic discharge units are disposed between the two first reference voltage buses, the display panel comprises a display area, the fourth electrostatic discharge units are disposed adjacent to the display area, and there are at least the first signal line, the second signal line, and the third signal line between every two adjacent groups of the plurality of electrostatic discharge unit groups.

In some embodiments, an electric potential of the first reference voltage bus and an electric potential of the second reference voltage bus have a same numerical value.

In some embodiments, the signal line is a data line, and both the plurality of electrostatic discharge units, and the at least one first reference voltage bus are disposed in a non-display area opposite to a bonding area.

In some embodiments, the signal line is a gate line, and both the plurality of electrostatic discharge units, and the at least one first reference voltage bus are disposed in a non-display area in a direction in which the gate line extends.

In some embodiments, the display panel of claim further comprises: a second reference voltage bus, wherein each of the plurality of electrostatic discharge unit groups comprises: a first electrostatic discharge unit and a second electrostatic discharge unit substantially symmetrically arranged on two sides of the first reference voltage bus in the first direction; and a third electrostatic discharge unit, wherein the plurality of gate lines are divided into a plurality of gate line groups in one-to-one correspondence with the plurality of electrostatic discharge unit groups, and each of the plurality of gate line groups comprises: a first gate line electrically connected to the first reference voltage bus through the first electrostatic discharge unit of a corresponding one of the plurality of electrostatic discharge unit groups; a second gate line electrically connected to the first reference voltage bus through the second electrostatic discharge unit of the corresponding one of the plurality of electrostatic discharge unit groups; and a third gate line electrically connected to the second reference voltage bus through the third electrostatic discharge unit of the corresponding one of the plurality of electrostatic discharge unit groups.

In some embodiments, the at least one first reference voltage bus comprises two first reference voltage buses, each of the plurality of electrostatic discharge unit groups comprises: a first electrostatic discharge unit and a second electrostatic discharge unit substantially symmetrically arranged on two sides of one of the two first reference voltage buses in the first direction; and a third electrostatic discharge unit and a fourth electrostatic discharge unit substantially symmetrically arranged on two sides of the other of the two first reference voltage buses in the first direction, and the plurality of gate lines are divided into a plurality of gate line groups in one-to-one correspondence with the plurality of electrostatic discharge unit groups, and each of the plurality of gate line groups comprises: a first gate line electrically connected to the one of the two first reference voltage buses through the first electrostatic discharge unit of a corresponding one of the plurality of electrostatic discharge unit groups; a second gate line electrically connected to the one of the two first reference voltage buses through the second electrostatic discharge unit of the corresponding one of the plurality of electrostatic discharge unit groups; a third gate line electrically connected to the other of the two first reference voltage buses through the third electrostatic discharge unit of the corresponding one of the plurality of electrostatic discharge unit groups; and a fourth gate line electrically connected to the other of the two first reference voltage buses through the fourth electrostatic discharge unit of the corresponding one of the plurality of electrostatic discharge unit groups.

According to another aspect of the present disclosure, there is provided a display apparatus comprising the above mentioned display panel.

DETAILED DESCRIPTION

Figure 1:
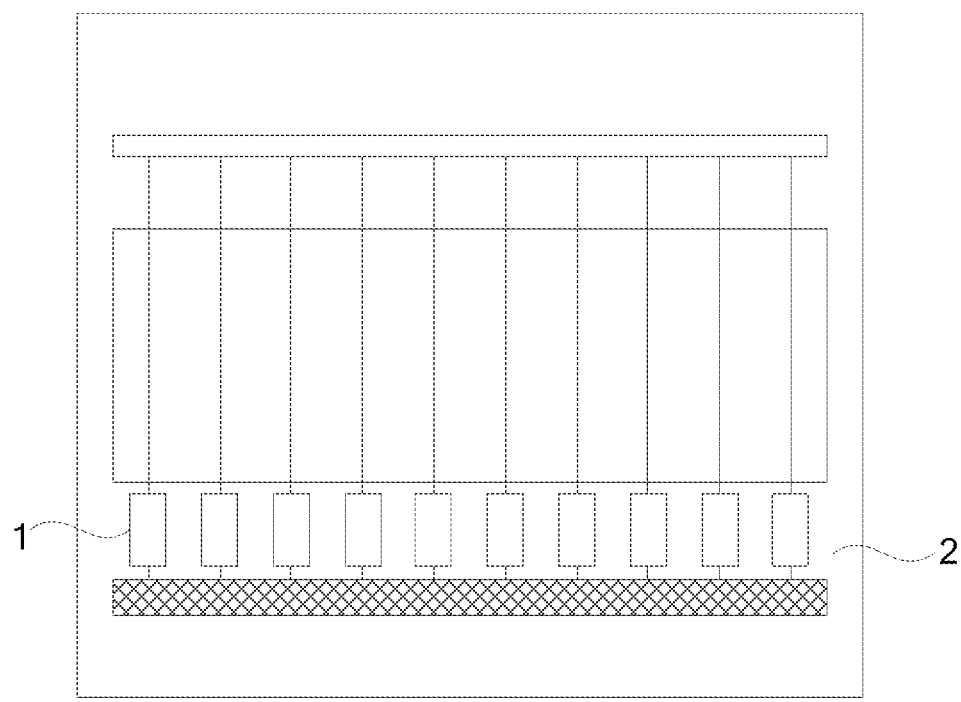
FIG. 1 is a schematic diagram showing an arrangement of electrostatic discharge units in related art.

The terms "first", "second" and the like used herein are used for distinguishing different objects from one another rather than indicating any specific sequence. Moreover, the terms "include", "comprise" and any other variants thereof are intended to cover non-exclusive inclusion. For example, a process, method, system, product or equipment that includes a series of steps or units are not limited to the steps or units that have been listed, and optionally further includes steps or units that are not listed, or optionally further includes other steps or units that are inherent to the process, method, system, product or equipment.

The term "and/or" used herein is only used to describe a correlational relationship between correlational objects to represent that there may be three relationships between the correlational objects. For example, A and/or B may mean three situations, i.e., may mean that A exists alone, both A and B exist, and B exists alone. In addition, the character "/" used herein generally represents that there is an "or" relationship between correlational objects before and after it unless otherwise specifically stated.

References in the specification to "one embodiment", "an embodiment", etc., indicate that a particular feature, structure, or characteristic described in conjunction with the embodiment may be included in at least one embodiment of the present disclosure. Moreover, such phrases in the specification are not necessarily referring to the same embodiment, and nor is it an independent or alternative embodiment mutually exclusive with other embodiments. Further, when a particular feature, structure, or characteristic is described in connection with an embodiment, it is understood that it is within the knowledge of one skilled in the art to effect such feature, structure, or characteristic in connection with other embodiments whether or not explicitly described.

In order to better understand the above technical solutions, a detailed description of the technical solutions of the present disclosure will be made as below with reference to embodiments taken in conjunction with the drawings. It should be understood that the embodiments of the present disclosure and the specific features in the embodiments are used to describe the technical solutions of the present disclosure in detail, rather than to limit the technical solutions of the present disclosure. The embodiments of the present disclosure and the technical features in the embodiments may be combined with one another unless they conflict. Further, shapes and sizes of these components/elements shown in the drawings do not reflect real proportion, but are intended only to illustrate the contents of the present disclosure.

FIG. 1 shows an arrangement of electrostatic discharge units in related art. Specifically, electrostatic discharge units 1 are arranged in a line in an extending direction of a gate line and are located on the same side of a binding area 2. In this case, for a display panel with a high pixel density, a large number of electrostatic discharge units 1 are needed, and it is often difficult to arrange the electrostatic discharge units in a limited wiring space, thereby affecting the display effect of the display panel. For example, in the display panel with the high pixel density, only two electrostatic discharge units can be accommodated in a space between adjacent pixel units. If four electrostatic discharge units are required to ensure the electrostatic protection performance of the display panel, undoubtedly the limited layout space cannot meet the layout needs.

In view of this, embodiments of the present disclosure provide a display panel and a display apparatus to achieve the electrostatic protection of the display panel in a limited space.

Figure 2:
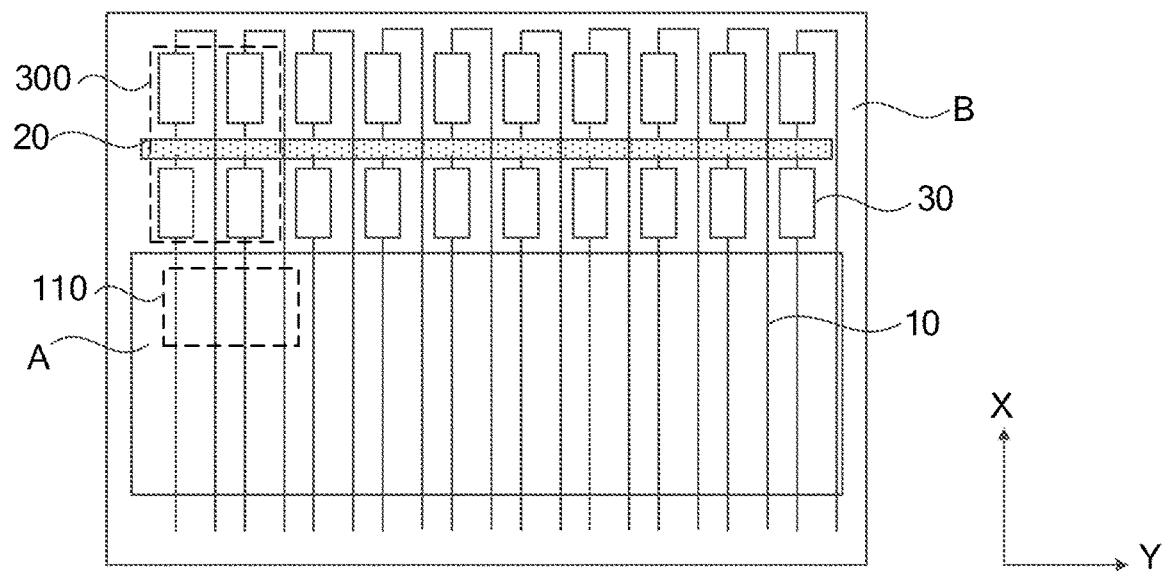
FIG. 2 is a schematic diagram showing a structure of a display panel according to an embodiment of the present disclosure.

As shown in FIG. 2, a display panel according to an embodiment of the present disclosure comprises signal lines 10 running in a first direction in a display area A and extending into a non-display area B.

In a specific implementation, the signal line 10 may be a data line or a gate line. If the signal line 10 is the data line, the first direction is an extending direction of the data line, which may be a direction indicated by the arrow X in FIG. 2. Furthermore, in a specific implementation, the display area A may be configured to display an image. A relative positional relationship between the display area A and the non-display area B may be such that the non-display area B surrounds the display area A. In this way, the display area A may be disposed inside the non-display area B. For example, the non-display area B may be disposed on an upper side of the display area A. It is to be noted that the relative positional relationship between the display area A and the non-display area B is not limited to this.

The display panel further comprises at least one first reference voltage bus 20 which extends in a second direction in the non-display area B, the second direction intersecting the first direction.

In a specific implementation, if the signal line 10 is the data line, the second direction is an extending direction of the gate line, which may be a direction indicated by the arrow Y in FIG. 2.

The display panel further comprises electrostatic discharge units 30 disposed on two sides of the first reference voltage bus 20 in the non-display area B. Optionally, the electrostatic discharge units 30 are disposed substantially symmetrically about the first reference voltage bus 20. Here, the phase "substantially symmetrically" means that two symmetrical electrostatic discharge units 30 are offset from each other to a certain extent in the second direction without affecting the wiring. In the embodiment, the signal lines 10 are electrically connected to the first reference voltage bus 20 through the electrostatic discharge units 30.

In a specific implementation, a plurality of electrostatic discharge units 30 are provided. FIG. 2 is a schematic diagram showing a structure in which the signal line 10 is a data line, the number of the first reference voltage bus 20 is one, and the electrostatic discharge units 30 are disposed on two sides of the first reference voltage bus 20 in the non-display area B. In this way, the wiring space of the electrostatic discharge units 30 in the second direction is decreased.

In the embodiments of the present disclosure, the electrostatic discharge units 30 are disposed on two opposite sides of the first reference voltage bus 20 in the non-display area B, and the electrostatic discharge units 30 are disposed substantially symmetrically about the first reference voltage bus 20, thereby reducing the space occupied by the electrostatic discharge units 30 in the second direction. As a result, while taking account of the high pixel density of the display panel, it is ensured that the electrostatic discharge units 30 can realize the electrostatic protection of the display panel in a limited space, thereby guaranteeing the display effect of the display panel.

Figure 3:
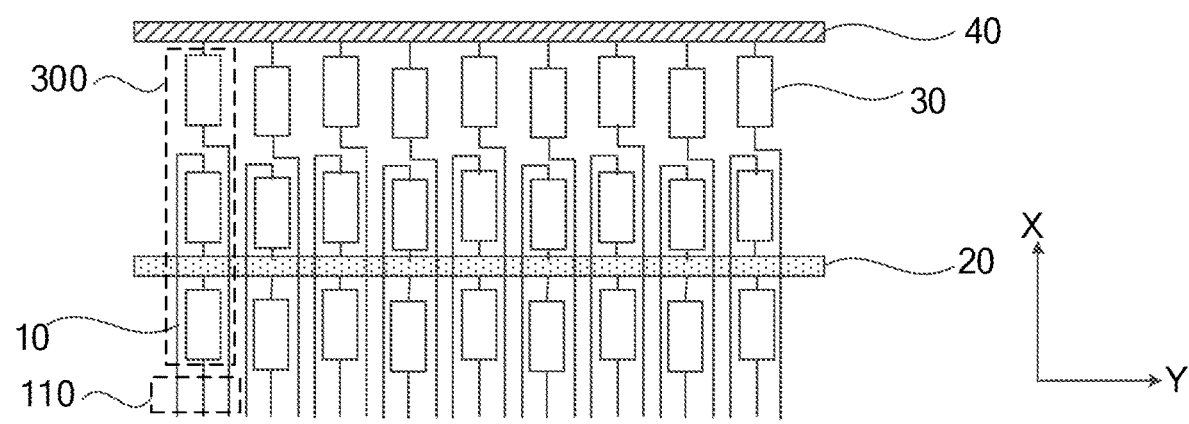
FIG. 3 is a schematic diagram showing a structure of a wiring of a display panel according to an embodiment of the present disclosure.

In an embodiment of the present disclosure, as illustrated in FIG. 3 which is a schematic diagram showing a structure of a wiring of a display panel, the display panel further comprises at least one second reference voltage bus 40 which extends in the second direction in the non-display area B, and the second reference voltage bus 40 and the first reference voltage bus 20 do not overlap each other. Electrostatic discharge units 30 are also disposed on a side of the second reference voltage bus 40 close to the first reference voltage bus 20, and are combined with the electrostatic discharge units 30 disposed on the two sides of the first reference voltage bus 20 into a whole. The electrostatic discharge units 30 are substantially aligned in the first direction. Here, the phase "substantially aligned" means that the electrostatic discharge units are offset from each other to a certain extent in the second direction without affecting the wiring. In this way, the space occupied by the electrostatic discharge units 30 in the second direction is reduced. In other words, the electrostatic discharge units 30 are disposed on only one side of the second reference voltage bus 40, as illustrated in FIG. 3 which is a schematic diagram showing a structure in which there is one second reference voltage bus 40. In a specific implementation, the first reference voltage bus 20 and the second reference voltage bus 40 are disposed, and the electrostatic discharge units 30 are disposed on the corresponding sides of the reference voltage buses, thereby further reducing the wiring space of the electrostatic discharge units 30 in the second direction.

Figure 4:
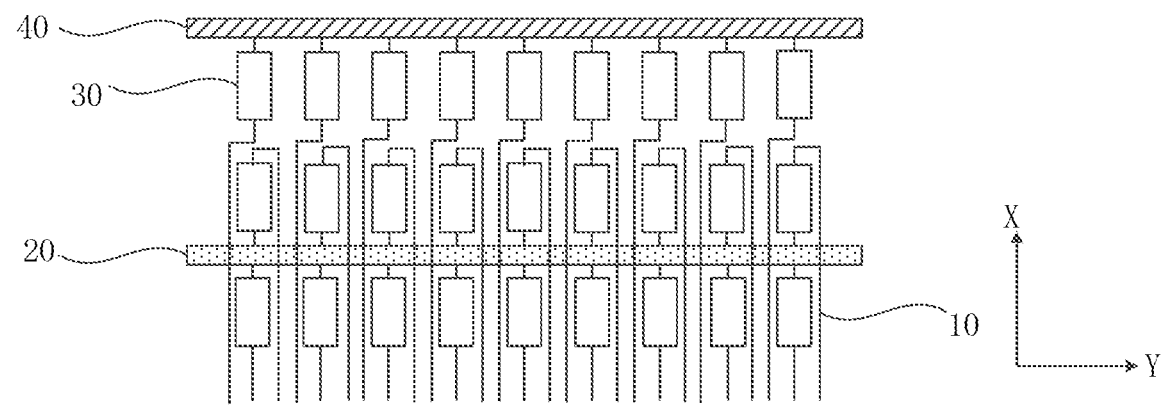
FIG. 4 is a schematic diagram showing a structure of a wiring of a display panel according to another embodiment of the present disclosure.

In an embodiment of the present disclosure, as illustrated in FIG. 4 which is a schematic diagram showing a structure of a wiring of a display panel, specifically, the arrangement of the electrostatic discharge units 30, the first reference voltage bus 20 and the second reference voltage bus 40 shown in FIG. 4 is the same as that of the electrostatic discharge units 30, the first reference voltage bus 20 and the second reference voltage bus 40 shown in FIG. 3, but the connection wiring between the signal lines 10 and the electrostatic discharge units shown in FIG. 4 and the connection wiring between the signal lines 10 and the electrostatic discharge units shown in FIG. 3 are different from each other and mirror-symmetrical. When one pixel comprises three sub-pixels, electrostatic discharge units 30 respectively connected to signal lines corresponding to the three sub-pixels are aligned in the first direction, and electrostatic discharge units 30 for two adjacent pixels are arranged in the second direction, respectively. In this way, the space occupied by the electrostatic discharge units 30 in the first direction is reduced.

Figure 5:
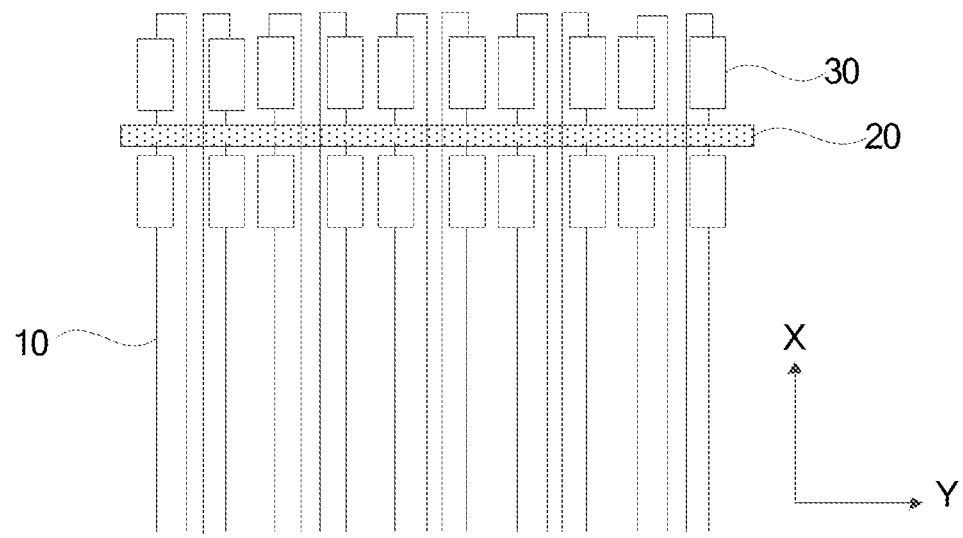
FIG. 5 is a schematic diagram showing a structure of a wiring of a display panel according to still another embodiment of the present disclosure.

In an embodiment of the present disclosure, as illustrated in FIG. 5 which is a schematic diagram showing a structure of a wiring of a display panel, the number of the first reference voltage bus 20 is one. In the case where one pixel comprises four sub-pixels, four sub-pixels of each pixel are connected to four electrostatic discharge units on two sides of the first reference voltage bus 20, respectively, so that every four electrostatic discharge units constitute a group of electrostatic discharge units. Signal lines 10 to which two of the group of electrostatic discharge units 30 away from the display area A are electrically connected are located on an inner side, while signal lines 10 to which the other two of the group of electrostatic discharge units 30 close to the display area A are electrically connected are located on an outer side. In this way, the signal lines 10 are arranged according to the distance between two adjacent pixel units in the second direction. Thereby, the wiring space of the signal lines 10 in the second direction is reduced, and a high-precision display panel can be manufactured.

Figure 6:
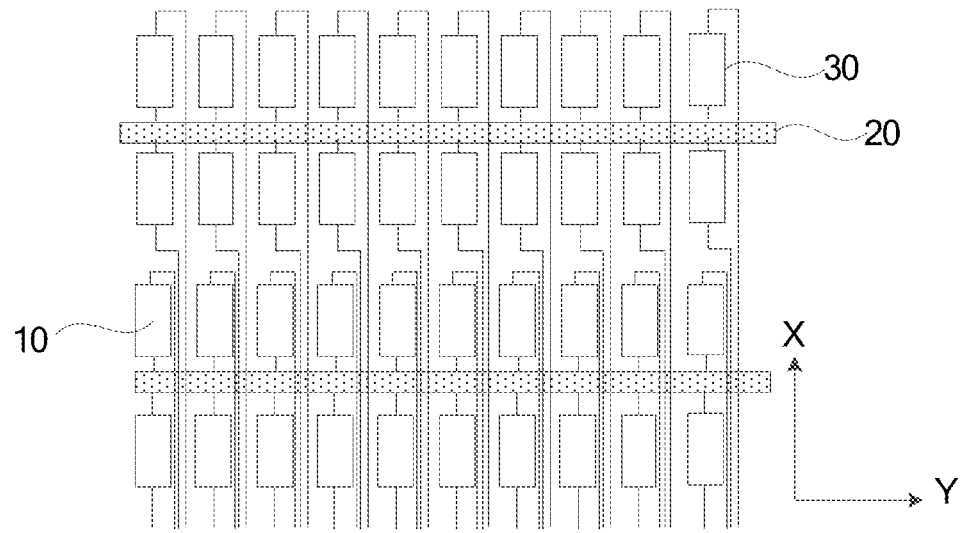
FIG. 6 is a schematic diagram showing a structure of a wiring of a display panel according to yet another embodiment of the present disclosure.

In an embodiment of the present disclosure, as illustrated in FIG. 6 which is a schematic diagram showing a structure of a wiring of a display panel, the number of the first reference voltage buses 20 is two, and the electrostatic discharge units are disposed on two sides of each first reference voltage bus 20. The electrostatic discharge units respectively located on the two sides of one of the two first reference voltage bus 20 and the two sides of the other of the two first reference voltage bus 20 are aligned in the first direction, respectively. As shown in FIG. 6, every four electrostatic discharge units are arranged in a column in the first direction and form a cycle corresponding to red, green, blue and white sub-pixels. All of signal lines that are respectively connected to three of the column of electrostatic discharge units other than one, closest to the display area, of the column of electrostatic discharge units are bent to be disposed on a right side of the column of electrostatic discharge units after respectively leading out from the three electrostatic discharge units. Since the signal lines 10 are arranged in sequence in the second direction, the wiring space of the signal lines 10 and the electrostatic discharge units 30 in the second direction is saved, and it is possible to perform electrostatic protection on the high-precision display panel, while taking account of the high-precision display effect and the electrostatic protection.

Figure 7:
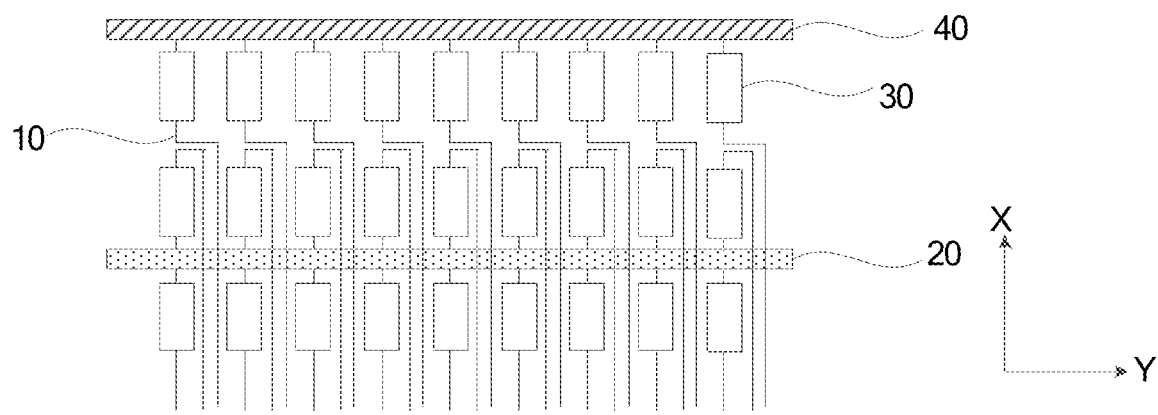
FIG. 7 is a schematic diagram showing a structure of a wiring of a display panel according to a further embodiment of the present disclosure.

In an embodiment of the present disclosure, as illustrated in FIG. 7 which is a schematic diagram showing a structure of a wiring of a display panel, the number of the second reference voltage bus 40 is one, and the number of the first reference voltage bus 20 is one. the arrangement of the electrostatic discharge units 30, the first reference voltage bus 20 and the second reference voltage bus 40 shown in FIG. 7 is the same as those of the electrostatic discharge units 30, the first reference voltage bus 20 and the second reference voltage bus 40 shown in FIGS. 3 and 4, but the connection wiring between the signal lines 10 and the electrostatic discharge units 30 shown in FIG. 7 is different from those between the signal lines 10 and the electrostatic discharge units 30 shown in FIGS. 3 and 4. In this way, the signal lines 10 electrically connected to the electrostatic discharge units 30 are arranged in sequence in a direction away from the display area A. Thereby, the space occupied by the signal lines 10 can be compressed accordingly, the wiring space of the signal lines 10 and the electrostatic discharge units 30 can be saved, and it is possible to perform electrostatic protection on the high-precision display panel, while taking account of the high-precision display effect and the electrostatic protection.

Figure 8:
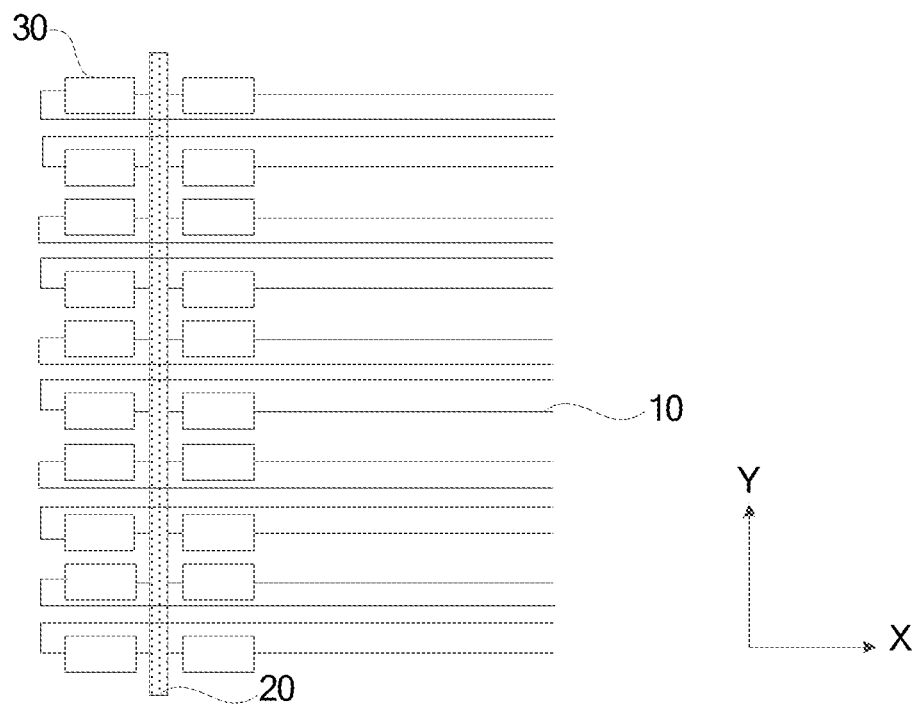
FIGS. 8-10 are schematic diagrams showing structures of wirings of display panels in the case where a signal line is a gate line according to embodiments of the present disclosure.
Figure 9:
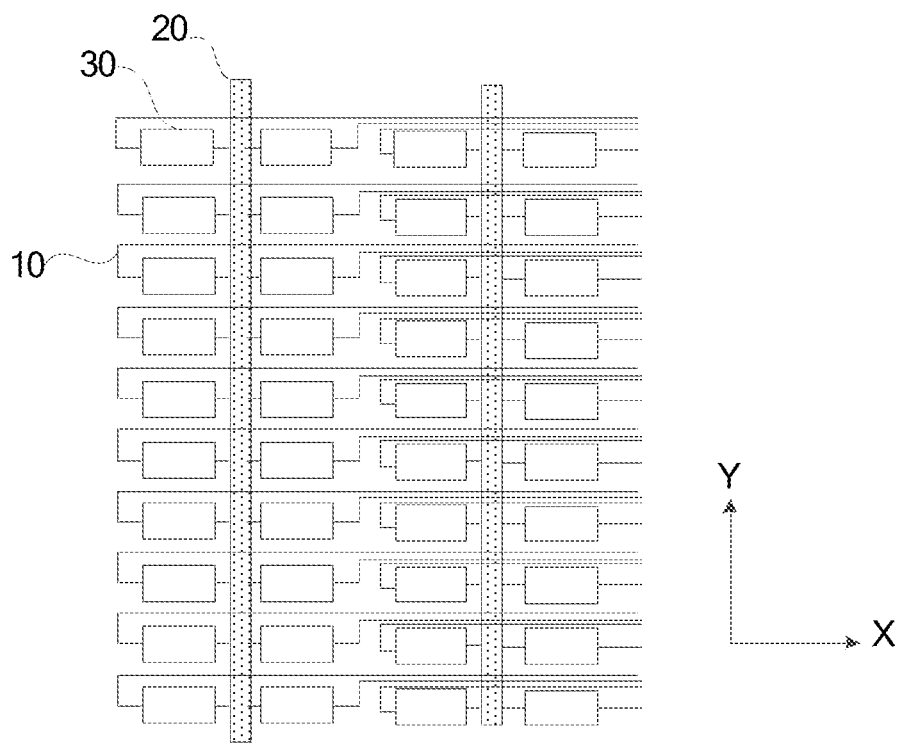
Figure 10:
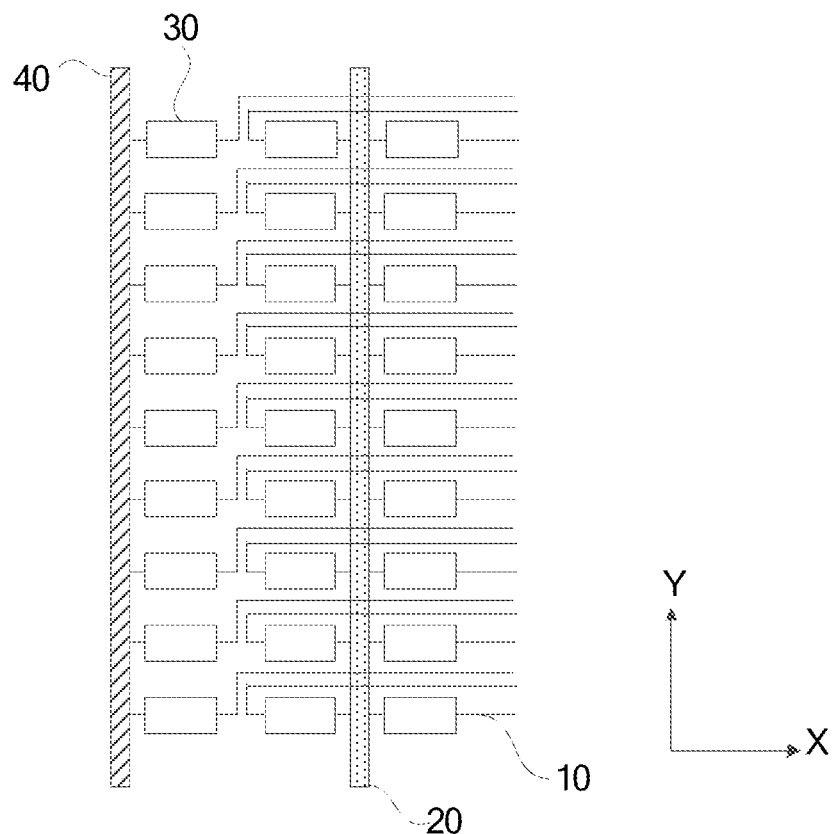

In an embodiment of the present disclosure, when the signal line 10 is a gate line, the electrostatic discharge units 30 may also be disposed in the non-display area B opposite to the gate lines in each of the manners shown in FIGS. 8 to 10. The specific arrangement in the case where the signal line 10 is the gate line is substantially the same as that in the case where the signal line 10 is the data line, and is no longer described herein for the sake of brevity.

In the embodiments of the present disclosure, the electrostatic discharge units 30 as shown in FIGS. 2, 5 and 6 may be disposed for four data lines for red, green, blue and white sub-pixels, the electrostatic discharge units 30 as shown in FIGS. 3, 4 and 7 may also be disposed for three data lines for red, green, and blue sub-pixels, the electrostatic discharge units 30 as shown in FIGS. 8-9 may also be disposed for four gate lines for red, green, blue and white sub-pixels, and the electrostatic discharge units 30 as shown in FIG. 10 may also be disposed for three gate lines for red, green, and blue sub-pixels. Of course, the wiring position of the electrostatic discharge units 30 may also be set based on the above-mentioned inventive concept according to the actual requirements for the precision of the display panel and the electrostatic protection capability.

Specifically, as shown in FIGS. 3, 4 and 7, for the arrangement of three data lines for red, green, and blue sub-pixels, a plurality of signal lines 10 extends in a first direction; at least one first reference voltage bus 20 extends in a second direction; and a plurality of electrostatic discharge units 30 are divided into a plurality of electrostatic discharge unit groups 300. The plurality of electrostatic discharge unit groups 300 are arranged in the second direction and each of the plurality of electrostatic discharge unit groups 300 comprises at least two electrostatic discharge units 30 arranged in the first direction.

In the embodiment, at least one of the plurality of signal lines 10 is electrically connected to the first reference voltage bus 20 through at least one of the plurality of electrostatic discharge units 30.

The display panel further comprises a second reference voltage bus 40. Each of the plurality of electrostatic discharge unit groups 300 comprises: a first electrostatic discharge unit and a second electrostatic discharge unit substantially symmetrically arranged on two sides of the first reference voltage bus 20 in the first direction; and a third electrostatic discharge unit.

The plurality of signal lines 10 are divided into a plurality of signal line groups 110 in one-to-one correspondence with the plurality of electrostatic discharge unit groups 300, and each of the plurality of signal line groups 110 comprises: a first signal line electrically connected to the first reference voltage bus 20 through the first electrostatic discharge unit of a corresponding one of the plurality of electrostatic discharge unit groups; a second signal line electrically connected to the first reference voltage bus 20 through the second electrostatic discharge unit of the corresponding one of the plurality of electrostatic discharge unit groups; and a third signal line electrically connected to the second reference voltage bus 40 through the third electrostatic discharge unit of the corresponding one of the plurality of electrostatic discharge unit groups.

The second reference voltage bus 40 extends in the second direction, and the first reference voltage bus 20 and the second reference voltage bus 40 are arranged side by side in the first direction, and the first electrostatic discharge units and the third electrostatic discharge units are located between the first reference voltage bus 20 and the second reference voltage bus 40.

The display panel comprises a display area. The second reference voltage bus 40 is located on a side of the first reference voltage bus 20 away from the display area, and there are at least the first signal line and the third signal line between every two adjacent groups of the plurality of electrostatic discharge unit groups 300.

As shown in FIG. 9, the at least one first reference voltage bus 20 comprises two first reference voltage buses. Each of the plurality of electrostatic discharge unit groups 300 comprises: a first electrostatic discharge unit and a second electrostatic discharge unit substantially symmetrically arranged on two sides of one of the two first reference voltage buses 20 in the first direction; and a third electrostatic discharge unit and a fourth electrostatic discharge unit substantially symmetrically arranged on two sides of the other of the two first reference voltage buses 20 in the first direction.

The plurality of signal lines 10 are divided into a plurality of signal line groups 110 in one-to-one correspondence with the plurality of electrostatic discharge unit groups 300. Each of the plurality of signal line groups 110 comprises: a first signal line electrically connected to the one of the two first reference voltage buses 20 through the first electrostatic discharge unit of a corresponding one of the plurality of electrostatic discharge unit groups; a second signal line electrically connected to the one of the two first reference voltage buses 20 through the second electrostatic discharge unit of the corresponding one of the plurality of electrostatic discharge unit groups; a third signal line electrically connected to the other of the two first reference voltage buses 20 through the third electrostatic discharge unit of the corresponding one of the plurality of electrostatic discharge unit groups; and a fourth signal line electrically connected to the other of the two first reference voltage buses 20 through the fourth electrostatic discharge unit of the corresponding one of the plurality of electrostatic discharge unit groups.

The two first reference voltage buses 20 are arranged side by side in the first direction, the second electrostatic discharge unit and the third electrostatic discharge units are disposed between the two first reference voltage buses 20, the display panel comprises a display area, the fourth electrostatic discharge units are disposed adjacent to the display area, and there are at least the first signal line, the second signal line, and the third signal line between every two adjacent groups of the plurality of electrostatic discharge unit groups 300.

For the arrangement of the signal lines 10 in the case where the signal lines 10 are gate lines, as shown in FIGS. 8-10, both the plurality of electrostatic discharge units 30, and the at least one first reference voltage bus 20 are disposed in a non-display area in a direction in which the gate line extends.

As shown in FIG. 10, for the arrangement of three gate lines for red, green, and blue sub-pixels, the display panel further comprises a second reference voltage bus 40. Each of the plurality of electrostatic discharge unit groups 300 comprises: a first electrostatic discharge unit and a second electrostatic discharge unit substantially symmetrically arranged on two sides of the first reference voltage bus 20 in the first direction; and a third electrostatic discharge unit.

The plurality of gate lines are divided into a plurality of gate line groups in one-to-one correspondence with the plurality of electrostatic discharge unit groups 300, and each of the plurality of gate line groups comprises: a first gate line electrically connected to the first reference voltage bus 20 through the first electrostatic discharge unit of a corresponding one of the plurality of electrostatic discharge unit groups; a second gate line electrically connected to the first reference voltage bus 20 through the second electrostatic discharge unit of the corresponding one of the plurality of electrostatic discharge unit groups; and a third gate line electrically connected to the second reference voltage bus 40 through the third electrostatic discharge unit of the corresponding one of the plurality of electrostatic discharge unit groups.

As shown in FIG. 9, for the arrangement of four gate lines for red, green, blue and white sub-pixels, the at least one first reference voltage bus 20 comprises two first reference voltage buses. Each of the plurality of electrostatic discharge unit groups 300 comprises: a first electrostatic discharge unit and a second electrostatic discharge unit substantially symmetrically arranged on two sides of one of the two first reference voltage buses 20 in the first direction; and a third electrostatic discharge unit and a fourth electrostatic discharge unit substantially symmetrically arranged on two sides of the other of the two first reference voltage buses 20 in the first direction.

The plurality of gate lines are divided into a plurality of gate line groups in one-to-one correspondence with the plurality of electrostatic discharge unit groups 300, and each of the plurality of gate line groups comprises: a first gate line electrically connected to the one of the two first reference voltage buses 20 through the first electrostatic discharge unit of a corresponding one of the plurality of electrostatic discharge unit groups; a second gate line electrically connected to the one of the two first reference voltage buses 20 through the second electrostatic discharge unit of the corresponding one of the plurality of electrostatic discharge unit groups; a third gate line electrically connected to the other of the two first reference voltage buses 20 through the third electrostatic discharge unit of the corresponding one of the plurality of electrostatic discharge unit groups; and a fourth gate line electrically connected to the other of the two first reference voltage buses 20 through the fourth electrostatic discharge unit of the corresponding one of the plurality of electrostatic discharge unit groups.

In an embodiment of the present disclosure, an electric potential of the first reference voltage bus 20 and an electric potential of the second reference voltage bus 40 have a same numerical value. In this way, the first reference voltage bus 20 and the second reference voltage bus may be electrically connected to each other. Thereby, the discharge space of electrostatic charges is increased, and thus the electrostatic protection capability of the display panel is improved.

In an embodiment of the present disclosure, the signal line 10 is a data line, and both the plurality of electrostatic discharge units 30, and the at least one first reference voltage bus 20 are disposed in a non-display area B opposite to a bonding area C. In this way, the space of the non-display area B of the display panel opposite to the binding area C is fully utilized while the wiring space of the binding area C is saved, thereby reducing the frame of the display panel in the binding area C and thus achieving the narrow-frame design of the display panel.

In an embodiment of the present disclosure, the signal line 10 is a gate line, and both the plurality of electrostatic discharge units 30, and the at least one first reference voltage bus 20 are disposed in a non-display area B in a direction in which the gate line extends. In this way, the gate lines of the display panel are fully protected against static electricity while the wiring space of the binding area C is saved. Thereby the electrostatic protection effect of the display panel is improved while the narrow-frame design of the display panel is realized.

Figure 11:
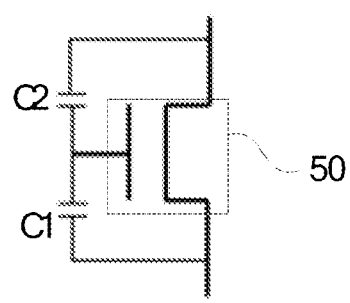
FIG. 11 is a schematic diagram showing a structure of an electrostatic discharge unit of a display panel according to an embodiment of the present disclosure.

In an embodiment of the present disclosure, as illustrated in FIG. 11 which is a schematic diagram showing a structure of an electrostatic discharge unit 30, specifically, the electrostatic discharge unit 30 comprises a switching device 50. The switching device 50 comprises a source electrode electrically connected to the signal line 10, a drain electrode electrically connected to the first reference voltage bus 20, and a gate electrode. A first capacitor C1 is disposed between the gate electrode and the source electrode of the switching device, and a second capacitor C2 is disposed between the gate electrode and the drain electrode of the switching device. In a specific implementation, an extension length of the electrostatic discharge unit 30 in the second direction is about 30 μm, for example, 25 μm to 35 μm. In this way, the electrostatic protection of even the high-precision display panel can be realized by the electrostatic discharge unit 30.

Figure 12:
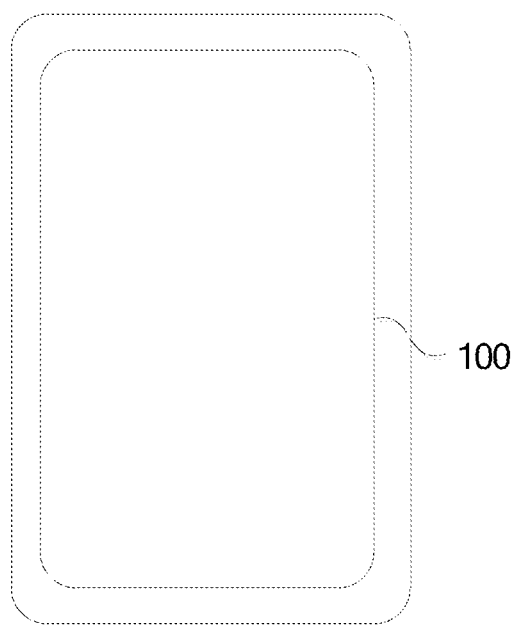
FIG. 12 is a schematic diagram showing a structure of a display apparatus according to an embodiment of the present disclosure.

Base on the same inventive concept, as shown in FIG. 12, embodiments of the present disclosure further provide a display apparatus comprising the above-mentioned display panel 100. Since principles of the display apparatus for solving the problem are similar to those of the display panel, the implementations of the display panel may be referred to for implementations of the display apparatus, and repeated contents are no longer described herein for the sake of brevity.

In a specific implementation, the display apparatus according to the embodiment of the present disclosure may comprise a mobile telephone as shown in FIG. 12. Of course, the display apparatus according to the embodiments of the present disclosure may further comprise any products or parts having a display function such as a tablet computer, a television, a display, a notebook computer, a digital frame, and a navigator. Other indispensable components of the display apparatus will be understood by those skilled in the art, are no longer described herein for the sake of brevity, and should not be construed to limit the present disclosure.

In the display panel and the display apparatus according to the embodiments of the present disclosure, the electrostatic discharge units 30 are disposed in the non-display area B and on two opposite sides of the first reference voltage bus 20 in the first direction in which the signal line 10 extends, and the electrostatic discharge units 30 are disposed substantially symmetrically about the first reference voltage bus 20, thereby reducing the space occupied by the electrostatic discharge units 30 in the second direction. As a result, while taking account of the high pixel density of the display panel, it is ensured that the electrostatic discharge units 30 can realize the electrostatic protection of the display panel in a limited space, thereby guaranteeing the display effect of the display panel.

Although the preferred embodiments of the present disclosure have been described, those skilled in the art can make additional changes and modifications to these embodiments once they know the basic creative concepts. Therefore, the appended claims are intended to be construed to include the preferred embodiments and all of the changes and modifications falling within the scope the present disclosure.

Apparently, various changes and modifications to the present disclosure may be made by those skilled in the art without departing from the spirit and scope of the disclosure. Therefore, if these amendments and modifications to the present disclosure belong to the scope defined by the appended claims of the present disclosure and their equivalents, the present disclosure is intended to include the changes and modifications.

What is claimed is:

1. A display panel comprising:
a plurality of signal lines extending in a first direction;
at least one first reference voltage bus which extends in a second direction intersecting the first direction; and
a plurality of electrostatic discharge units divided into a plurality of electrostatic discharge unit groups, wherein the plurality of electrostatic discharge unit groups are arranged in the second direction and each of the plurality of electrostatic discharge unit groups comprises at least two electrostatic discharge units arranged in the first direction,
wherein at least one of the plurality of signal lines is electrically connected to the first reference voltage bus through at least one of the plurality of electrostatic discharge units; and
the display panel further comprises:
a second reference voltage bus, wherein each of the plurality of electrostatic discharge unit group comprises: a first electrostatic discharge unit and a second electrostatic discharge unit substantially symmetrically arranged on two sides of the first reference voltage bus in the first direction; and a third electrostatic discharge unit,
wherein the plurality of signal lines are divided into a plurality of signal line groups in one-to-one correspondence with the plurality of electrostatic discharge unit groups, and each of the plurality of signal line groups comprises: a first signal line electrically connected to the first reference voltage bus through the first electrostatic discharge unit of a corresponding one of the plurality of electrostatic discharge unit groups; a second signal line electrically connected to the first reference voltage bus through the second electrostatic discharge unit of the corresponding one of the plurality of electrostatic discharge unit groups; and a third signal line electrically connected to the second reference voltage bus through the third electrostatic discharge unit of the corresponding one of the plurality of electrostatic discharge unit groups.

2. The display panel of claim 1, wherein:
each of the plurality of electrostatic discharge unit groups comprises a first electrostatic discharge unit and a second electrostatic discharge unit substantially symmetrically arranged on two sides of the first reference voltage bus in the first direction.

3. The display panel of claim 2, wherein:
the plurality of signal lines are divided into a plurality of signal line groups in one-to-one correspondence with the plurality of electrostatic discharge unit groups, and each of the plurality of signal line groups comprises: a first signal line electrically connected to the first reference voltage bus through the first electrostatic discharge unit of a corresponding one of the plurality of electrostatic discharge unit groups; and a second signal line electrically connected to the first reference voltage bus through the second electrostatic discharge unit of the corresponding one of the plurality of electrostatic discharge unit groups.

4. The display panel of claim 3, wherein:
there is at least one of the plurality of signal lines between every two adjacent groups of the plurality of electrostatic discharge unit groups.

5. The display panel of claim 1, wherein:
the second reference voltage bus extends in the second direction, and the first reference voltage bus and the second reference voltage bus are arranged side by side in the first direction, and the first electrostatic discharge units and the third electrostatic discharge units are located between the first reference voltage bus and the second reference voltage bus.

6. The display panel of claim 1, wherein:
the display panel comprises a display area, the second reference voltage bus is located on a side of the first reference voltage bus away from the display area, and there are at least the first signal line and the third signal line between every two adjacent groups of the plurality of electrostatic discharge unit groups.

7. The display panel of claim 1, wherein:
the at least one first reference voltage bus comprises two first reference voltage buses, each of the plurality of electrostatic discharge unit groups comprises: a first electrostatic discharge unit and a second electrostatic discharge unit substantially symmetrically arranged on two sides of one of the two first reference voltage buses in the first direction; and a third electrostatic discharge unit and a fourth electrostatic discharge unit substantially symmetrically arranged on two sides of the other of the two first reference voltage buses in the first direction, and
the plurality of signal lines are divided into a plurality of signal line groups in one-to-one correspondence with the plurality of electrostatic discharge unit groups, and each of the plurality of signal line groups comprises: a first signal line electrically connected to the one of the two first reference voltage buses through the first electrostatic discharge unit of a corresponding one of the plurality of electrostatic discharge unit groups; a second signal line electrically connected to the one of the two first reference voltage buses through the second electrostatic discharge unit of the corresponding one of the plurality of electrostatic discharge unit groups; a third signal line electrically connected to the other of the two first reference voltage buses through the third electrostatic discharge unit of the corresponding one of the plurality of electrostatic discharge unit groups; and a fourth signal line electrically connected to the other of the two first reference voltage buses through the fourth electrostatic discharge unit of the corresponding one of the plurality of electrostatic discharge unit groups.

8. The display panel of claim 7, wherein:
the two first reference voltage buses are arranged side by side in the first direction, the second electrostatic discharge unit and the third electrostatic discharge units are disposed between the two first reference voltage buses, the display panel comprises a display area, the fourth electrostatic discharge units are disposed adjacent to the display area, and there are at least the first signal line, the second signal line, and the third signal line between every two adjacent groups of the plurality of electrostatic discharge unit groups.

9. The display panel of claim 1, wherein:
an electric potential of the first reference voltage bus and an electric potential of the second reference voltage bus have a same numerical value.

10. The display panel of claim 1, wherein:
the signal line is a data line, and both the plurality of electrostatic discharge units, and the at least one first reference voltage bus are disposed in a non-display area opposite to a bonding area.

11. The display panel of claim 1, wherein:
the signal line is a gate line, and both the plurality of electrostatic discharge units, and the at least one first reference voltage bus are disposed in a non-display area in a direction in which the gate line extends.

12. The display panel of claim 11, further comprising:
a second reference voltage bus, wherein each of the plurality of electrostatic discharge unit groups comprises: a first electrostatic discharge unit and a second electrostatic discharge unit substantially symmetrically arranged on two sides of the first reference voltage bus in the first direction; and a third electrostatic discharge unit,
wherein the plurality of gate lines are divided into a plurality of gate line groups in one-to-one correspondence with the plurality of electrostatic discharge unit groups, and each of the plurality of gate line groups comprises: a first gate line electrically connected to the first reference voltage bus through the first electrostatic discharge unit of a corresponding one of the plurality of electrostatic discharge unit groups; a second gate line electrically connected to the first reference voltage bus through the second electrostatic discharge unit of the corresponding one of the plurality of electrostatic discharge unit groups; and a third gate line electrically connected to the second reference voltage bus through the third electrostatic discharge unit of the corresponding one of the plurality of electrostatic discharge unit groups.

13. The display panel of claim 11, wherein:
the at least one first reference voltage bus comprises two first reference voltage buses, each of the plurality of electrostatic discharge unit groups comprises: a first electrostatic discharge unit and a second electrostatic discharge unit substantially symmetrically arranged on two sides of one of the two first reference voltage buses in the first direction; and a third electrostatic discharge unit and a fourth electrostatic discharge unit substantially symmetrically arranged on two sides of the other of the two first reference voltage buses in the first direction, and
the plurality of gate lines are divided into a plurality of gate line groups in one-to-one correspondence with the plurality of electrostatic discharge unit groups, and each of the plurality of gate line groups comprises: a first gate line electrically connected to the one of the two first reference voltage buses through the first electrostatic discharge unit of a corresponding one of the plurality of electrostatic discharge unit groups; a second gate line electrically connected to the one of the two first reference voltage buses through the second electrostatic discharge unit of the corresponding one of the plurality of electrostatic discharge unit groups; a third gate line electrically connected to the other of the two first reference voltage buses through the third electrostatic discharge unit of the corresponding one of the plurality of electrostatic discharge unit groups; and a fourth gate line electrically connected to the other of the two first reference voltage buses through the fourth electrostatic discharge unit of the corresponding one of the plurality of electrostatic discharge unit groups.

14. A display apparatus comprising the display panel of claim 1.

* * * * *